US008638126B2

(12) United States Patent
Lo et al.

(10) Patent No.: US 8,638,126 B2
(45) Date of Patent: Jan. 28, 2014

(54) RAIL-TO-RAIL COMPARATOR

(75) Inventors: Chieh-Min Lo, Zhunan Township, Miaoli County (TW); Tzu-Huan Chiu, Taichung (TW); Chien-Sheng Chen, Toufen Township, Miaoli County (TW); Chien-Ping Lu, Tainan (TW)

(73) Assignee: Richtek Technology Corporation, R.O.C., Chupei, Hsin-Chu (TW)

( * ) Notice: Subject to any disclaimer, the term of this patent is extended or adjusted under 35 U.S.C. 154(b) by 84 days.

(21) Appl. No.: 13/352,963

(22) Filed: Jan. 18, 2012

(65) Prior Publication Data
US 2013/0181776 A1 Jul. 18, 2013

(51) Int. Cl.
*H03K 5/22* (2006.01)
(52) U.S. Cl.
USPC .......................................................... 327/65
(58) Field of Classification Search
USPC ................... 327/63, 65, 66, 68; 330/252–253
See application file for complete search history.

(56) References Cited

U.S. PATENT DOCUMENTS

| 5,675,289 | A | * | 10/1997 | Schrittesser | 330/253 |
| 6,559,687 | B1 | | 5/2003 | Hunt | |
| 7,027,027 | B2 | * | 4/2006 | Minamizaki et al. | 345/98 |
| 7,064,609 | B1 | * | 6/2006 | Beck et al. | 330/253 |
| 7,683,714 | B2 | * | 3/2010 | Nishimura et al. | 330/253 |
| 2011/0025654 | A1 | * | 2/2011 | Nishimura et al. | 345/204 |

* cited by examiner

*Primary Examiner* — Quan Tra
(74) *Attorney, Agent, or Firm* — Tung & Associates

(57) ABSTRACT

The present invention discloses a rail-to-rail comparator. The rail-to-rail comparator includes: a positive voltage rail providing a positive supply voltage, a ground voltage rail providing a ground voltage, an input stage, and an output stage. The input stage includes: a positive and a negative input terminals for receiving a first input signal and a second input signal; a first differential amplifier circuit, which includes a pair of depletion NMOS transistors to generate a first pair of differential currents; and a second differential amplifier circuit, which includes a pair of native NMOS transistors to generate a second pair of differential currents. The output stage is coupled to the first differential amplifier circuit and the second differential amplifier circuit, and generates an output signal related to a difference between the first input signal and the second input signal.

5 Claims, 5 Drawing Sheets

RAIL-TO-RAIL COMPARATOR

BACKGROUND OF THE INVENTION

1. Field of Invention

The present invention relates to a rail-to-rail comparator; particularly, it relates to such rail-to-rail comparator having a pair of depletion N-type metal oxide semiconductor (NMOS) transistors and a pair of native NMOS transistors as differential amplifier circuits of an input stage, such that the rail-to-rail comparator has a maximum operation range and may operate under a low supply voltage.

2. Description of Related Art

FIG. 1 shows a typical symbol of a comparator. As shown in the figure, a comparator 10 includes a positive input terminal and a negative input terminal; the positive terminal receives a first input signal Vp and the negative terminal receives a second input signal Vn. The comparator 10 generates an output signal Vo according to a difference between the first input signal Vp and the second input signal Vn. The comparator 10 receives high and low operation voltages, which are for example a positive supply voltage Vdd and a ground voltage GND respectively, and therefore the operation range of the comparator 10 is between the positive supply voltage Vdd and the ground voltage GND, i.e., the first input signal Vp and the second input signal Vn should both be between the positive supply voltage Vdd and the ground voltage GND.

The typical comparator 10 includes a pair of differential transistors having gates respectively receiving the first input signal Vp and the second input signal Vn. If the pair of the differential transistors are PMOS transistors, the highest voltages of the input signals Vp and Vn that can be compared by the comparator are equal to or less than Vdd-Vthp, wherein Vthp is the threshold voltage of the PMOS transistor. The reason is that, for a PMOS transistor to be able to operate meaningfully, an absolute value of its gate-to-source voltage difference (Vgs) must be at least equal to the threshold voltage Vthp. On the other hand, if the pair of the differential transistors are NMOS transistors, the lowest voltages of the input signals Vp and Vn that can be compared by the comparator are equal to or higher than Vthn, wherein Vthn is the threshold voltage of the NMOS transistor. The reason is that, assuming the low level of the operation voltage is the ground voltage (0V), for an NMOS transistor to be able to operate meaningfully, an absolute value of its gate-to-source voltage difference (Vgs) must be at least equal to the threshold voltage Vthn. Therefore, the comparator 10 is not able to compare the first input signal Vp and the second input signal Vn within a sub-range (the range higher than Vdd-Vthp for PMOS transistors, or the range lower than Vthn for NMOS transistors) of the operation range of the comparator 10 (from the ground voltage GND to the positive supply voltage Vdd), and this means that the first input signal Vp and the second input signal Vn cannot be within the sub-range.

In view of the above, a prior art rail-to-rail comparator is provided. FIG. 2 illustrates a configuration of a rail-to-rail comparator 20 of U.S. Pat. No. 6,559,687. As shown in the figure, the rail-to-rail comparator 20 includes a bias stage 21 and a gain stage 22, which both receive the first input signal Vp and the second input signal Vn, and operate between a positive supply voltage Vdd1 provided by a positive voltage rail and the ground voltage GND provided by a ground voltage rail. The bias stage 21 provides a bias signal Bias to the gain stage 22 according to the first input signal Vp and the second input signal Vn. The bias signal Bias is used to compensate gain of the comparator 20 and to keep the comparator 20 operating normally when the input signals Vp and Vn are close to the ground voltage GND or the positive supply voltage Vdd1.

FIG. 3 shows a block diagram of the bias stage 21 of the comparator 20 of the U.S. Pat. No. 6,559,687. As shown in the figure, the bias stage 21 includes a p-channel differential circuit 211, an n-channel differential circuit 213, and a bias source 215. The p-channel differential circuit 211 is referenced to the positive supply voltage Vdd1 and the n-channel differential circuit 213 is referenced to the ground voltage GND. As the inputs Vp and Vp approach either the positive voltage Vdd1 or the ground voltage GND, the p-channel differential circuit 211 or the n-channel differential circuit 213 provides an appropriate gain to the bias source 215 according to the input signals Vp and Vn. The bias source 215 is configured to provide the bias signal Bias for compensating the distortion of the output signal Vo when the input signals Vp and Vn are close to the positive supply voltage Vdd1 or the ground voltage GND.

FIG. 4 shows the detail circuitry of the gain stage 22 of the comparator of U.S. Pat. No. 6,559,687. As shown in the figure, the nodes 2211 and 2231 receive current signals controlled by the bias signal Bias, as the gains to be inputted to a gain source 225. When the input signals Vp and Vn are close to the ground voltage GND, a p-channel differential circuit 221 can operate normally. When the PMOS transistors of the p-channel differential circuit 221 are conductive, currents are generated which pass through nodes 2251 and 2252 respectively, such that the transistors Q1 and Q2 generate a positive output signal Z and the transistors Q1' and Q2' generate a negative output signal ZN, which are compensated by corresponding gains respectively. Therefore, the comparator 20 can operate to generate the correct output signal Vo even though the input signals are close to the ground voltage GND.

On the other hand, when the input signals Vp and Vn are close to the positive supply voltage Vdd1, an n-channel differential circuit 223 can operate normally. When NMOS transistors are conductive, currents are generated which pass through nodes 2253 and 2254 respectively, such that the transistors Q3 and Q4 generate a positive output signal Z and the transistors Q3' and Q4' generate a negative output signal ZN, which are compensated by corresponding gains respectively. Therefore, the comparator 20 can operate to generate the correct output signal Vo even though the input signals are close to the positive supply voltage Vdd1.

Although the aforementioned prior art comparator can operate rail-to-rail, one of the drawbacks of the prior art is that devices used in the circuitry limit the positive supply voltage Vdd1 to be not less than a specific level. However, it is a trend that the positive supply voltage in an integrated circuit keeps decreasing nowadays, so this prior art limits the applications of the rail-to-rail comparator.

More specifically, as shown in FIG. 7, a bar chart at the left side of the figure shows an operation range Vhrp of the input signals Vp and Vn with respect to the p-channel differential circuit 211 (i.e. the p-channel differential circuit 211 can compare the input signals Vp and Vn correctly only if the input signals Vp and Vn are within the operation range Vhrp). The p-channel differential circuit 211 includes a pair of PMOS differential transistors and a PMOS transistor Q11. Therefore, the operation range Vhrp is from the ground voltage GND to less than the positive supply voltage Vdd1, that is, excluding a gate-to-source voltage Vgsp of the PMOS transistor and a drain-to-source voltage Vds of the transistor Q11 from the positive supply voltage Vdd1, wherein the gate-to-source voltage Vgsp of the PMOS transistor is equal to its threshold voltage Vthp plus its drain-to-source voltage Vds, so the operation range Vhrp is:

$$0<Vhrp<(Vdd1-2*Vds-Vthp).$$

On the other hand, a bar chart at the right side of FIG. 7 shows an operation range Vhrn of the input signals Vp and Vn with respect to the n-channel differential circuit 213. The n-channel differential circuit 213 includes a pair of NMOS differential transistors and an NMOS transistor Q12. Therefore, the operation range Vhrn is from above the ground voltage GND to the positive supply voltage Vdd1, that is, excluding a gate-to-source voltage Vgsn of the NMOS transistor and a drain-to-source voltage Vds of the transistor Q12 from ground voltage GND, wherein the gate-to-source voltage Vgsn of the NMOS transistor is equal to its threshold voltage Vthn plus its drain-source voltage Vds, so the operation range Vhrn is:

$$(2*Vds+Vthn)<Vhrn<Vdd1.$$

From the above, the positive supply voltage Vdd1 is required to be at least larger than 4*Vds+Vthp+Vthn for the comparator in the U.S. Pat. No. 6,559,687 to operate rail-to-rail, otherwise there will be a certain range in which neither the p-channel differential circuit 211 nor the n-channel differential circuit 213 can operate normally. For example, the typical drain-to-source voltage Vds is around 0.15V; the typical gate-to-source threshold voltage of the PMOS transistor is 0.9V; the typical gate-to-source threshold voltage of the NMOS transistor is 0.6V. Therefore, the lowest positive supply voltage Vdd1 for the comparator to operate rail-to-rail is:

$$(4*Vds+Vthp+Vthn)=(4*0.15+0.9+0.6)V=2.1V.$$

That is, the positive supply voltage Vdd1 of the prior art comparator cannot be less than 2.1V if it is to operate rail-to-rail.

Different from the prior art comparator, the present invention proposes a rail-to-rail comparator, which uses a pair of depletion NMOS transistors and a pair of native NMOS transistors to operate in a maximum rail-to-rail operation range, and besides, the present invention can operate under a relatively lower positive supply voltage, such as 1.5V, such that the rail-to-rail comparator according to the present invention can be used in broader applications.

SUMMARY OF THE INVENTION

An objective of the present invention is to provide a rail-to-rail comparator.

To achieve the objective mentioned above, from one perspective, the present invention provides a rail-to-rail comparator including: a positive voltage rail, which provides a positive supply voltage; a ground voltage rail, which provides a ground voltage; an input stage, which is coupled to the positive voltage rail and the ground voltage rail, and the input stage includes: a positive and a negative input terminals for receiving a first input signal and a second input signal respectively, wherein the first input signal and the second input signal have voltage levels between the positive supply voltage and the ground voltage; a first differential amplifier circuit, which includes a pair of depletion N-type metal oxide semiconductor (NMOS) transistors coupled to the positive and negative input terminals to receive the first input signal and the second input signal respectively and generate a first pair of differential currents; and a second differential amplifier circuit, which includes a pair of native NMOS transistors coupled to the positive and negative input terminals to receive the first input signal and the second input signal respectively and generate a second pair of differential currents; and an output stage, which is coupled to the first differential amplifier circuit and the second differential amplifier circuit, for generating an output signal related to a difference between the first input signal and the second input signal according to the first pair of differential currents and the second pair of differential currents.

In one embodiment, each of the pair of depletion NMOS transistors preferably includes a gate, a drain, and a source, the gates being coupled to the positive and negative input terminals respectively, the drains being coupled to the positive voltage rail to generate the first pair of the differential currents, and the sources being coupled to the ground voltage rail.

In the aforementioned embodiment, preferably, the pair of depletion NMOS transistors includes a first depletion NMOS transistor, the gate of the first depletion NMOS transistor being coupled to the positive input terminal, and a second depletion NMOS transistor, the gate of the second depletion NMOS transistor being coupled to the negative input terminal, and wherein the first differential amplifier circuit further includes a first PMOS transistor and a second PMOS transistor, each of the first and second PMOS transistors including a gate, a source, and a drain; the gate of the first PMOS transistor being coupled to the negative input terminal, the drain of the first PMOS transistor being coupled to the drain of the first depletion NMOS transistor, the gate of the second PMOS transistor being coupled to the positive input terminal, and the drain of the second PMOS transistor being coupled to the drain of the second depletion NMOS transistor.

In the aforementioned embodiment, the PMOS transistors are preferably enhancement PMOS transistors.

In another embodiment of the rail-to-rail comparator, each of the pair of native NMOS transistors preferably includes a gate, a drain, and a source, the gates being coupled to the positive and negative input terminals respectively, the drains being coupled to the positive voltage rail to generate the second pair of the differential currents, and the second sources being coupled to the ground voltage rail.

In one embodiment, the positive supply voltage is less than 2V.

In yet another embodiment, the positive supply voltage is between 1.5V and 1.7V.

The objectives, technical details, features, and effects of the present invention will be better understood with regard to the detailed description of the embodiments below.

DESCRIPTION OF THE PREFERRED EMBODIMENTS

Figure 1:
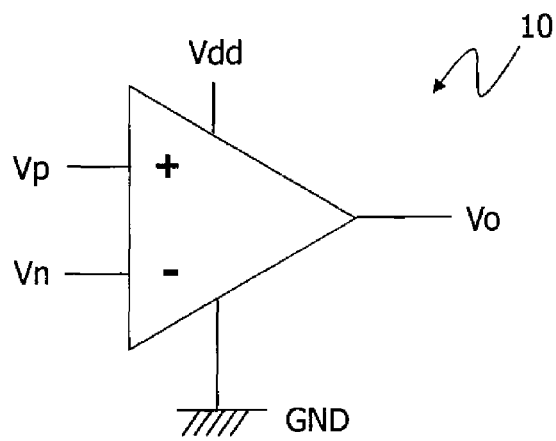
FIG. 1 shows a typical symbol of a comparator.
Figure 2:
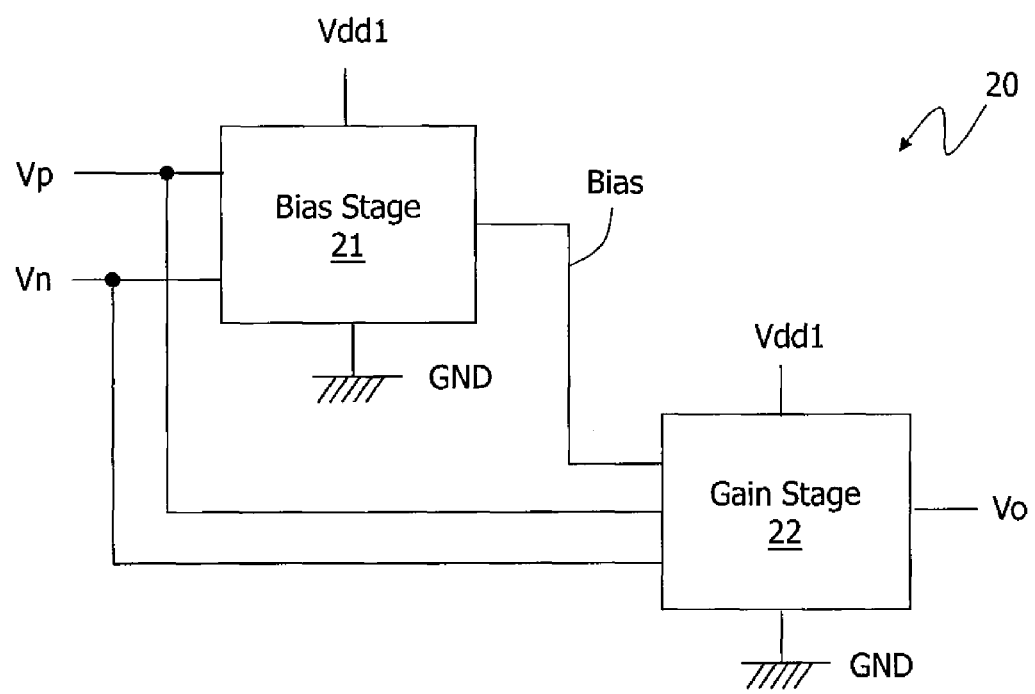
FIG. 2 illustrates a rail-to-rail comparator 20 of U.S. Pat. No. 6,559,687.
Figure 3:
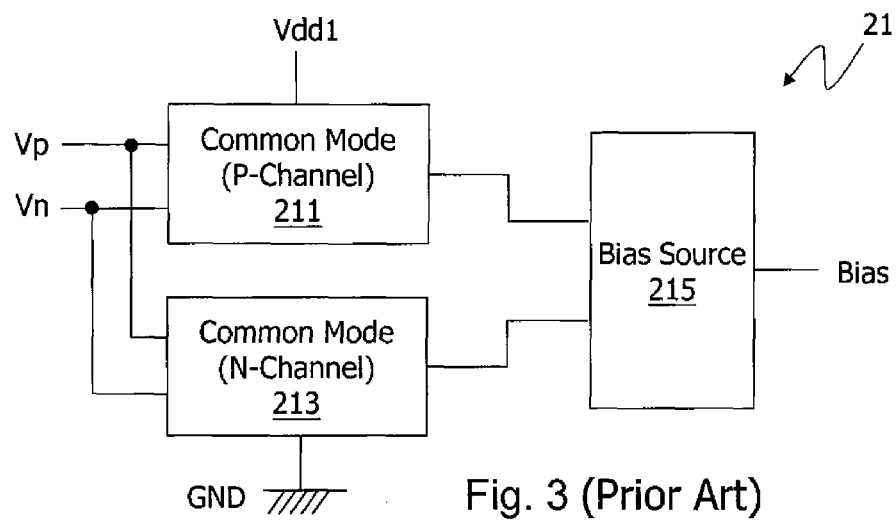
FIG. 3 shows the bias stage 21 of the comparator of U.S. Pat. No. 6,559,687.
Figure 4:
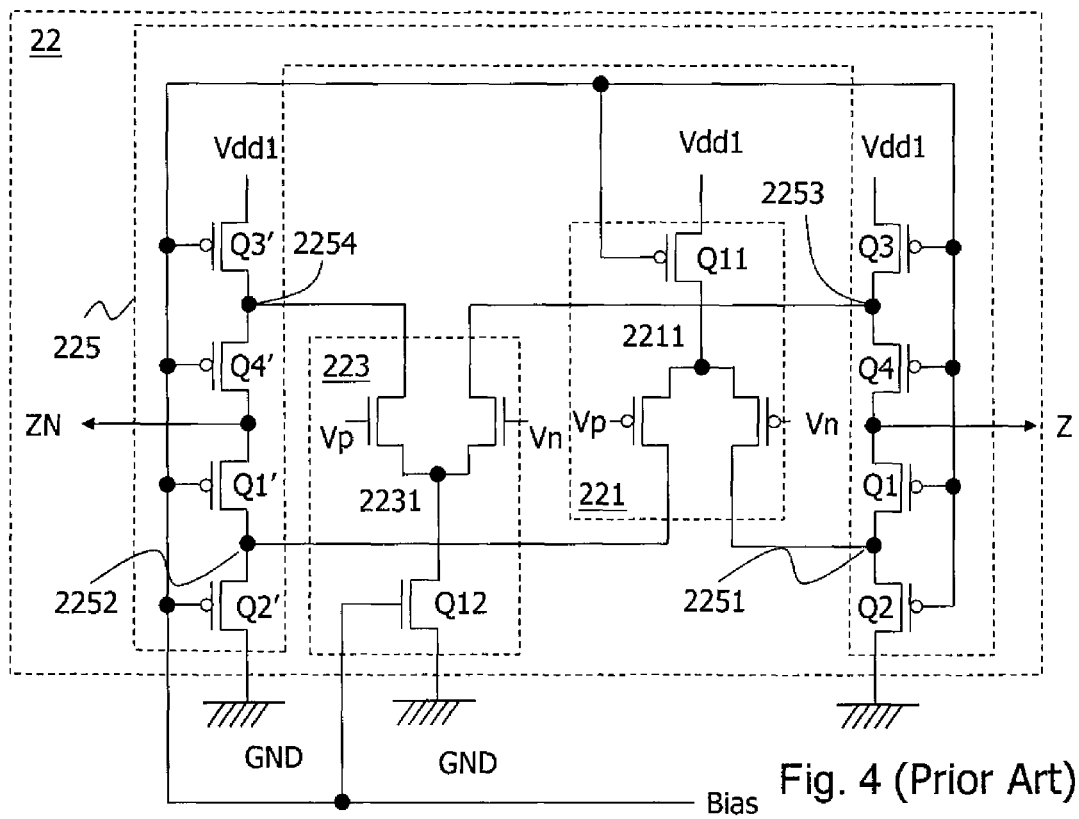
FIG. 4 shows the detailed circuitry of the gain stage 22 of the comparator of U.S. Pat. No. 6,559,687.
Figure 5:
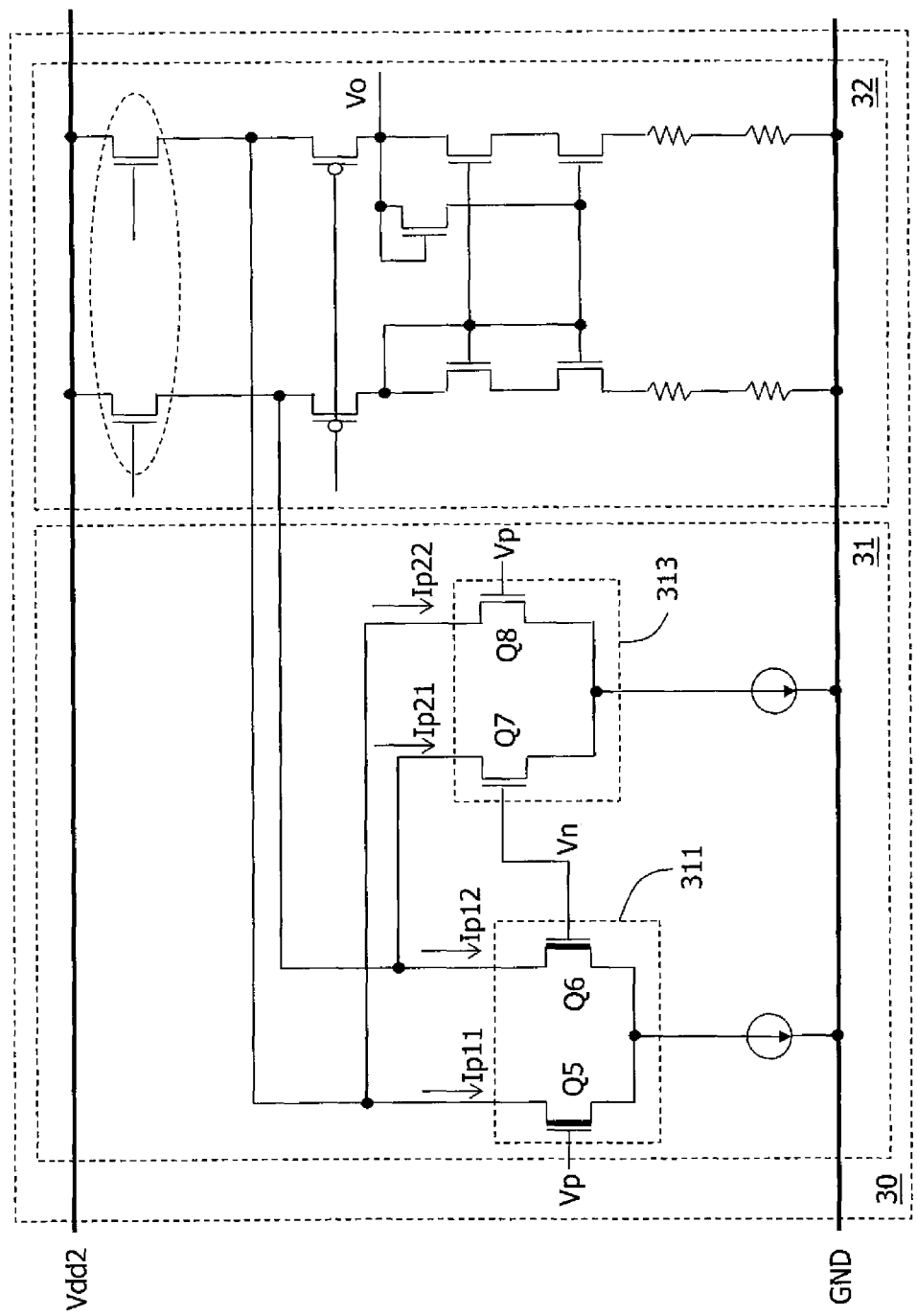
FIG. 5 shows a first embodiment of the present invention.

FIG. 5 shows a first embodiment of the present invention. As shown in the figure, a rail-to-rail comparator 30 includes a positive voltage rail for supplying a positive supply voltage Vdd2; a ground voltage rail for supplying the ground voltage GND; and an input stage 31 and an output stage 32. The input stage 31 is coupled to the positive voltage rail and the ground voltage rail, and it includes a positive input terminal for receiving the first input signal Vp and a negative input terminal for receiving the second input signal Vn. The first input signal Vp and the second input signal Vn have respective voltage levels between the positive supply voltage Vdd2 and the ground voltage GND. The rail-to-rail comparator 30 operates as follows. The input stage 31 converts a voltage difference between the first input signal Vp and the second input signal Vn to a first pair of differential currents Ip11, Ip12 and a second pair of differential currents Ip21, Ip22, and the output stage 32 converts them to an output voltage Vo, such that the output voltage Vo is related to the voltage difference between the first input signal Vp and the second input signal Vn. The output stage 32 may be designed according to requirements, and the circuit shown in FIG. 5 is only an example, not to limit the present invention. The output stage 32 can be modified in various ways, which are omitted here because it is not critical to this invention. The input stage 31 includes a first differential amplifier circuit 311 and a second differential amplifier circuit 313. The first differential amplifier circuit 311 includes a pair of depletion NMOS transistors, i.e., a first depletion NMOS transistor Q5 and a second depletion NMOS transistor Q6, which are coupled to the positive input terminal and the negative input terminal respectively to receive the first input signal Vp and the second input signal Vn, and to generate the first pair of differential currents Ip11, Ip12 respectively. The second differential amplifier circuit 313 includes a pair of native NMOS transistors Q7 and Q8, which are also coupled to the positive input terminal and the negative input terminal respectively to receive the first input signal Vp and the second input signal Vn, and to generate the second pair of differential currents Ip21, Ip22 respectively.

When the first input signal Vp and the second input signal Vn are to the ground voltage GND, the first depletion NMOS transistor Q5 and the second depletion NMOS transistor Q6 of the first differential amplifier circuit 311 can operate normally to generate the first pair of differential currents Ip11 and Ip12, such that the output stage 32 generates the correct output voltage Vo according to the first pair of the differential currents Ip11 and Ip12.

When the first input signal Vp and the second input signal Vn are close to the positive supply voltage Vdd2, the native NMOS transistors Q7 and Q8 of the second differential amplifier circuit 313 can operate normally to generate the second pair of differential currents Ip21 and Ip22, such that the output stage 32 generates the correct output voltage Vo according to the second pair of the differential currents Ip21 and Ip22. The input stage 31 and the output stage 32 provides a proper gain for the rail-to-rail comparator 30.

Referring to FIG. 5, each of the first and second depletion NMOS transistors Q5 and Q6 includes a gate, a drain, and a source. The gate of the first depletion NMOS transistor Q5 is coupled to the positive input terminal to receive the first input signal Vp, and the gate of the second depletion NMOS transistor Q6 is coupled to the negative input terminal to receive the second input signal Vn. Both drains of the transistors Q5 and Q6 are coupled to the positive voltage rail, for outputting the first pair of the differential currents Ip11 and Ip12 respectively. Both sources of the transistors Q5 and Q6 are coupled to the ground voltage rail. Still referring to FIG. 5, each of the native NMOS transistors Q7 and Q8 includes a gate, a drain, and a source. The gate of the native NMOS transistor Q7 is coupled to the negative input terminal to receive the second input signal Vn, and the gate of the native NMOS transistor Q8 is coupled to the positive input terminal to receive the first input signal Vp. Both drains of the transistors Q7 and Q8 are coupled to the positive voltage rail, for outputting the second pair of the differential currents Ip21 and Ip22 respectively. Both sources of the transistors Q7 and Q8 are coupled to the ground voltage rail.

Figure 6:
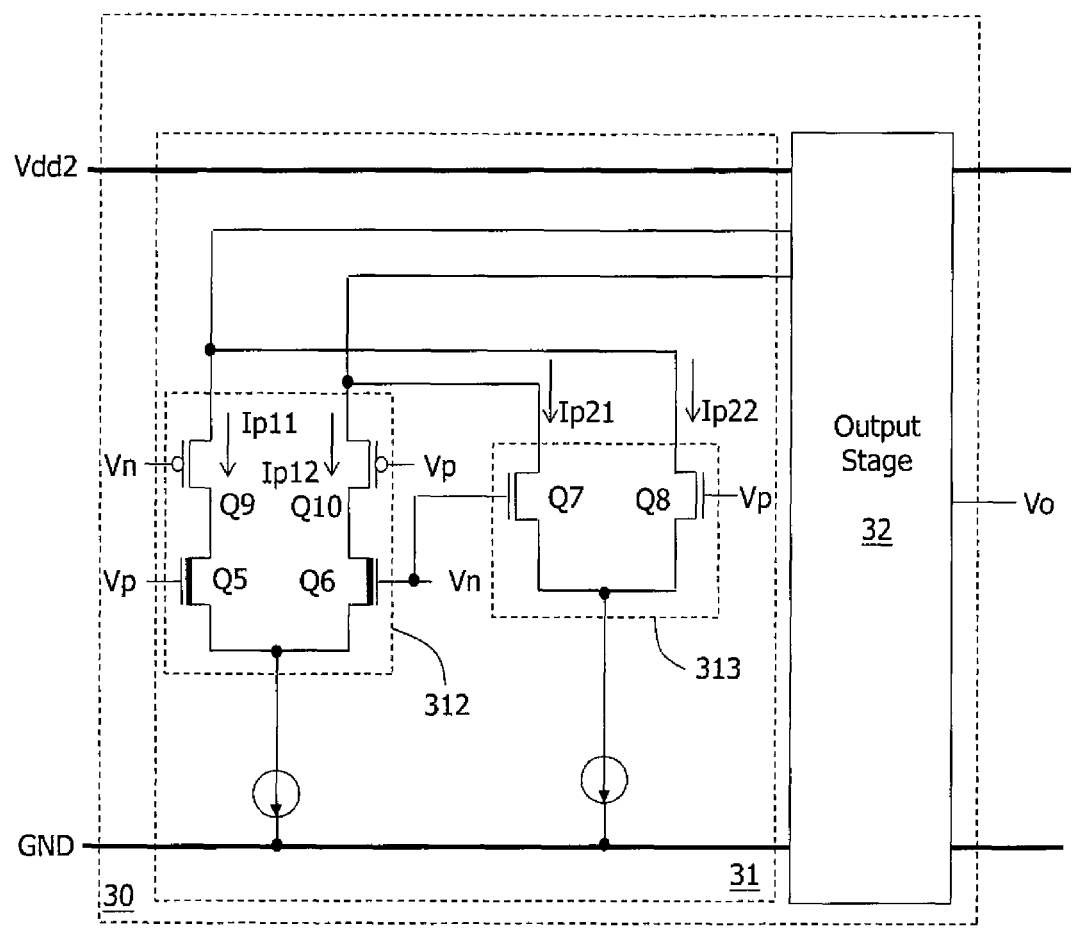
FIG. 6 shows a second embodiment of the present invention.

FIG. 6 shows a second embodiment of the present invention. This embodiment is different form the first embodiment in that, the first differential amplifier circuit 312 further includes a pair of PMOS transistors, i.e., a first PMOS transistor Q9 and a second PMOS transistor Q10. The first and second PMOS transistors are for example but not limited to enhancement PMOS transistors. Each of the first and second PMOS transistors Q9 and Q10 includes a gate, a source, and a drain. The gate of the first PMOS transistor Q9 is coupled to the negative input terminal to receive the second input signal Vn, and the gate of the second PMOS transistor Q10 is coupled to the positive input terminal to receive the first input signal Vp. Both sources of the transistors Q9 and Q10 are coupled to the positive voltage rail, for outputting the first pair of the differential currents Ip11 and Ip12 respectively. The drains of the transistors Q9 and Q10 are coupled to the drains of the first depletion NMOS transistor Q5 and the second depletion NMOS Q6 respectively. Besides, the gate of the first depletion NMOS transistor Q5 is coupled to the positive input terminal to receive the first input signal Vp, and the gate of the second depletion NMOS Q6 is coupled to the negative input terminal to receive the second input signal Vn. Both the sources of the depletion NMOS transistors Q5 and Q6 are coupled to the ground voltage rail. The first PMOS transistor Q9 and the second PMOS transistor Q10 are provided to form a cascode structure such that the drains of the first and second depletion NMOS transistors Q5 and Q6 will not be directly connected to the output stage 32; thus, the operation range of the transistors Q5 and Q6 will not be impacted, and the output voltage Vo is more correct.

Figure 7:
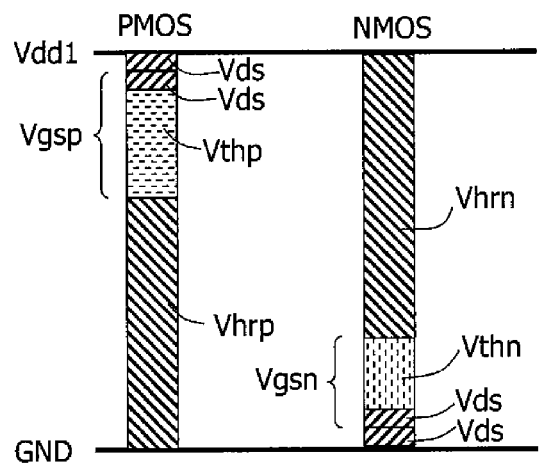
FIG. 7 shows the operation range of the comparator of U.S. Pat. No. 6,559,687.
Figure 8:
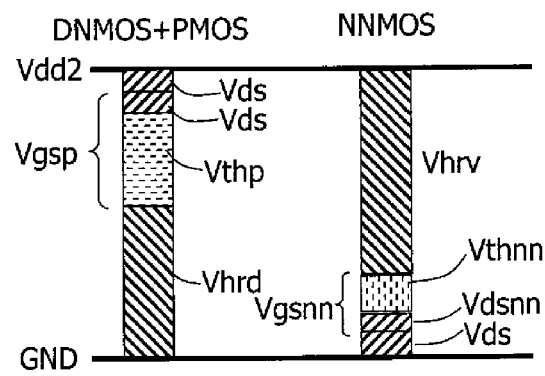
FIG. 8 shows the operation range of the comparator according to the second embodiment of the present invention.

Referring to FIGS. 7 and 8, a comparison between FIGS. 7 and 8 shows that the rail-to-rail comparator of the present invention can operate under an even lower supply voltage. FIG. 8 shows the operation range of the input signals, taking the embodiment shown in FIG. 6 as an example. In the prior art, as shown in FIG. 7, the positive supply voltage Vdd1 should at least be: $(4*0.15+0.9+0.6)V=2.1V$, as referring to the section "Description of Related Art".

In FIG. 8, a bar chart at the left side of the figure shows an operation range Vhrd of the input signals Vp and Vn with respect to the first differential circuit 312 shown in FIG. 6. The first differential circuit 312 includes a pair of PMOS transistors Q9 and Q10, and a pair of depletion NMOS transistors Q5 and Q6. The gates of the PMOS transistors Q9 and Q10 are connected to the gates of the depletion NMOS transistors Q6 and Q5 respectively, so the operation range Vhrd may be calculated by only adding the gate-to-drain voltage of the PMOS transistor and the drain-to-source voltage Vds of the upper transistor of the output stage 32 (indicated by the dashed-line circle shown in FIG. 5), and the operation range Vhrd is:

$$0 < Vhrd < (Vdd2-Vgsp-Vthp) = (Vdd2-2*Vds-Vthp).$$

And, a bar chart at the right side of FIG. 8 shows an operation range Vhrv of the input signals Vp and Vn with respect to the second differential circuit 313 shown in FIG. 6. The second differential circuit 313 includes a pair of native NMOS transistors Q7 and Q8, and in calculating the operation range Vhrv, it is required to add a drain-to-source voltage of a transistor (not shown) in the current source shown at the lower side of FIG. 6. Therefore, the operation range Vhrv is:

$$(Vds+Vdsnn+Vthnn)=(Vds+Vgsnn)<Vhrv<Vdd2,$$

wherein Vdsnn, Vthnn, and Vgsnn are drain-to-source voltage, threshold voltage, and gate-to-source voltage of the native NMOS transistor respectively.

A typical maximum drain-to-source voltage is about 0.15V; the threshold voltage of the PMOS transistor is 0.9V; and the gate-to-source voltage of the native NMOS transistor is 0.3V. Therefore, to operate rail-to-rail, the minimum voltage of the positive supply voltage Vdd2 is:

$$(2*Vds+Vthp+Vgsnn)=(2*0.15+0.9+0.3)V=1.5V.$$

That is, the minimum required voltage of the positive supply voltage Vdd2 is 1.5V in this invention. Even if the device characteristics may vary because of manufacturing deviations, the minimum required positive supply voltage is still between about 1.5V to about 1.7V. Note the above number is obtained based on the embodiment shown in FIG. 6. The minimum voltage of the positive supply voltage may be further reduced in the embodiment shown in FIG. 5, because it omits the PMOS transistors Q9 and Q10. Or, if the positive supply voltage is not reduced to minimum, the design of the output stage 32 and/or the current sources of the input stage 31 can be more flexible in the present invention as compared with the prior art. For example, the positive supply voltage can be slightly lower than 2V, in order for the current source to be more precise.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. For example, a device which does not substantially influence the primary function of a signal can be inserted between any two devices in the shown embodiments, such as a switch. For another example, the ground voltage GND is not necessarily an absolute grounding level (0V), and it may be a relative ground level. In view of the foregoing, the spirit of the present invention should cover all such and other modifications and variations, which should be interpreted to fall within the scope of the following claims and their equivalents.

What is claimed is:

1. A rail-to-rail comparator comprising:
a positive voltage rail, which provides a positive supply voltage;
a ground voltage rail, which provides a ground voltage;
an input stage, which is coupled to the positive voltage rail and the ground voltage rail, and the input stage includes:
a positive and a negative input terminals for receiving a first input signal and a second input signal respectively, wherein the first input signal and the second input signal have voltage levels between the positive supply voltage and the ground voltage;
a first differential amplifier circuit, which includes a first depletion N-type metal oxide semiconductor (NMOS) transistor having a gate coupled to the positive input terminal to receive the first input signal and a second depletion NMOS transistor having a gate coupled to the negative input terminal to receive the second input signal, wherein the first and second depletion NMOS transistors generate a first pair of differential currents;
a first PMOS transistor and a second PMOS transistor, each of the first and second PMOS transistors including a gate, a source, and a drain; the gate of the first PMOS transistor being coupled to the negative input terminal, the drain of the first PMOS transistor being coupled to a drain of the first depletion NMOS transistor, the gate of the second PMOS transistor being coupled to the positive input terminal, and the drain of the second PMOS transistor being coupled to a drain of the second depletion NMOS transistor; and
a second differential amplifier circuit, which includes a pair of native NMOS transistors coupled to the positive and negative input terminals to receive the first input signal and the second input signal respectively and generate a second pair of differential currents; and
an output stage, which is coupled to the first differential amplifier circuit and the second differential amplifier circuit, for generating an output signal related to a difference between the first input signal and the second input signal according to the first pair of differential currents and the second pair of differential currents.

2. The rail-to-rail comparator of claim 1, wherein each of the pair of native NMOS transistors includes a gate, a drain, and a source, the gates being coupled to the positive and negative input terminals respectively, the drains being coupled to the positive voltage rail to generate the second pair of the differential currents, and the second sources being coupled to the ground voltage rail.

3. The rail-to-rail comparator of claim 1, wherein the PMOS transistors are enhancement PMOS transistors.

4. The rail-to-rail comparator of claim 1, wherein the positive supply voltage is less than 2V.

5. The rail-to-rail comparator of claim 1, wherein the positive supply voltage is between 1.5V and 1.7V.

* * * * *